United States Patent
Yosui et al.

(10) Patent No.: US 10,893,618 B2
(45) Date of Patent: Jan. 12, 2021

(54) METHOD FOR MANUFACTURING MULTILAYER SUBSTRATE

(71) Applicant: Murata Manufacturing Co., Ltd., Nagaokakyo (JP)

(72) Inventors: Kuniaki Yosui, Nagaokakyo (JP); Naoki Gouchi, Nagaokakyo (JP); Shingo Ito, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/158,334

(22) Filed: Oct. 12, 2018

(65) Prior Publication Data

US 2019/0082542 A1    Mar. 14, 2019

Related U.S. Application Data

(63) Continuation of application No. PCT/JP2017/041737, filed on Nov. 21, 2017.

(30) Foreign Application Priority Data

Nov. 28, 2016 (JP) .................. 2016-229706

(51) Int. Cl.
*H05K 3/46* (2006.01)
*H05K 1/02* (2006.01)
(Continued)

(52) U.S. Cl.
CPC ....... *H05K 3/4632* (2013.01); *H01F 17/0013* (2013.01); *H01F 27/292* (2013.01);
(Continued)

(58) Field of Classification Search
CPC ......... H01F 41/04; H01F 5/00; H05K 1/0298; H05K 1/16; H05K 1/165; H05K 3/46;
(Continued)

(56) References Cited

U.S. PATENT DOCUMENTS 5,942,965 A * 8/1999 Kitamura ............ H01F 17/0013
                                                 174/255
6,051,448 A * 4/2000 Hayama ................ H01F 41/043
                                                  438/108
(Continued)

FOREIGN PATENT DOCUMENTS

JP    2-161709 A    6/1990
JP    4-368105 A    12/1992
(Continued)

OTHER PUBLICATIONS

Official Communication issued in International Patent Application No. PCT/JP2017/041737, dated Feb. 20, 2018.

*Primary Examiner* — Timothy J Thompson
*Assistant Examiner* — Rhadames Alonzo Miller
(74) *Attorney, Agent, or Firm* — Keating & Bennett, LLP

(57) ABSTRACT

A multilayer substrate includes a lamination body including a first resin substrate, a second resin substrate, and a bonding layer that are hot-pressed. A first conductor pattern including a surface defined by a plated film is disposed on a first surface of the first resin substrate. A second conductor pattern including a surface defined by a plated film is disposed on a second surface of the first resin substrate. A third conductor pattern including a surface defined by a plated film is disposed on a third surface of the second resin substrate. A fourth conductor pattern including a surface defined by a plated film is disposed on a fourth surface of the second resin substrate. The first conductor pattern is located closer to one outermost layer than the second conductor pattern is. The second conductor pattern is thinner than the first conductor pattern.

11 Claims, 12 Drawing Sheets

(51) Int. Cl.
*H05K 1/16* (2006.01)
*H01F 41/04* (2006.01)
*H01F 17/00* (2006.01)
*H01F 27/29* (2006.01)
*H05K 1/18* (2006.01)

(52) U.S. Cl.
CPC ......... *H01F 41/042* (2013.01); *H01F 41/043* (2013.01); *H05K 1/0298* (2013.01); *H05K 1/165* (2013.01); *H05K 3/462* (2013.01); *H05K 3/4614* (2013.01); *H05K 3/4652* (2013.01); *H05K 1/181* (2013.01)

(58) Field of Classification Search
CPC ... H05K 3/4614; H05K 3/4632; H05K 3/4652
See application file for complete search history.

(56) References Cited

U.S. PATENT DOCUMENTS

| | | | | |
|---|---|---|---|---|
| 6,218,925 | B1* | 4/2001 | Iwao | H01F 17/0013 336/200 |
| 6,437,677 | B1* | 8/2002 | Takeuchi | H01F 17/0013 336/200 |
| 2002/0067235 | A1* | 6/2002 | Ueda | H01F 17/0006 336/200 |
| 2003/0137384 | A1* | 7/2003 | Itou | H01F 17/0013 336/200 |
| 2004/0164835 | A1* | 8/2004 | Shoji | H01F 17/0013 336/200 |
| 2005/0188529 | A1* | 9/2005 | Uriu | H01F 17/0013 29/602.1 |
| 2005/0195062 | A1* | 9/2005 | Yoshida | H01F 27/2804 336/200 |
| 2006/0022788 | A1* | 2/2006 | Sasamori | H01F 17/043 336/208 |
| 2007/0085649 | A1* | 4/2007 | Park | H01F 17/0006 336/200 |
| 2007/0247268 | A1* | 10/2007 | Oya | H01F 17/0006 336/200 |
| 2009/0243780 | A1* | 10/2009 | Inoue | H01F 1/15366 336/200 |
| 2009/0322458 | A1* | 12/2009 | Lee | H01F 17/0006 335/299 |
| 2010/0052835 | A1* | 3/2010 | Lee | H01F 17/0013 336/83 |
| 2010/0259353 | A1* | 10/2010 | Saito | H01F 27/292 336/205 |
| 2013/0147592 | A1* | 6/2013 | Yoo | H01F 5/003 336/200 |
| 2013/0222101 | A1* | 8/2013 | Ito | H01F 17/04 336/83 |
| 2013/0335186 | A1* | 12/2013 | Chang | H01F 5/003 336/200 |

FOREIGN PATENT DOCUMENTS

| | | |
|---|---|---|
| JP | 6-217482 A | 8/1994 |
| JP | 9-232162 A | 9/1997 |
| JP | 10-163028 A | 6/1998 |
| JP | 2006-041418 A | 2/2006 |
| JP | 2008-205353 A | 9/2008 |
| JP | 2008-306007 A | 12/2008 |
| JP | 2010-010550 A | 1/2010 |
| JP | 2012-248630 A | 12/2012 |

* cited by examiner

METHOD FOR MANUFACTURING MULTILAYER SUBSTRATE

CROSS REFERENCE TO RELATED APPLICATIONS

This application claims the benefit of priority to Japanese Patent Application No. 2016-229706 filed on Nov. 28, 2016 and is a Continuation Application of PCT Application No. PCT/JP2017/041737 filed on Nov. 21, 2017. The entire contents of each application are hereby incorporated herein by reference.

BACKGROUND OF THE INVENTION

1. Field of the Invention

The present invention relates to a multilayer substrate including laminated and thermocompression-bonded substrates made of an insulating resin and conductor patterns on both surfaces thereof, a structure of the multilayer substrate mounted on a circuit board, a method for mounting the multilayer substrate, and a method for manufacturing the multilayer substrate.

2. Description of the Related Art

Some existing multilayer substrates, including substrates that include conductor patterns formed thereon and laminated together by hot pressing, include a narrowly-pitched coil pattern formed by plating for high density integration. Some other existing multilayer substrates include conductor patterns on both surfaces of the substrates to reduce the number of laminated substrates of the multilayer substrates.

For example, Japanese Patent Application Publication No. 2012-248630 describes a coil component formed by forming conductor patterns on both surfaces of substrates made of an insulating resin, depositing plated films on the conductor patterns, and laminating the substrates together.

According to a method of thickening conductor patterns or narrowing the distance between adjacent conductor patterns by plating, as plated films are thicker, the conductor patterns have a larger cross-sectional area, and thus the resistance of the conductor patterns per unit length is reduced. However, the growth rate (deposition rate) of the plated films vary depending on factors such as the convection state of a plating solution in a plating bath, the electrode interval in the case of electroplating, and the difference in shape between the conductor patterns. Therefore, further thickening the plated films is more likely to increase the difference in film thickness to further vary the thickness or width of the conductor patterns. Thus, narrowing the distance between the centers of the adjacent conductor patterns (narrowing the pitch) to highly densely arrange the conductor patterns would be more likely to bring the conductor patterns into contact with each other and cause a short circuit.

In a multilayer substrate formed by laminating resin substrates, the resin substrates are more easily subjected to heat in hot pressing and the resin flows further as they are located closer to the outermost layers. This resin flow is more likely to cause the conductor patterns to be short-circuited between layers.

SUMMARY OF THE INVENTION

Preferred embodiments of the present invention provide a multilayer substrate that prevents conductor patterns on which plated films are deposited from being short-circuited in a lamination direction, a structure of the multilayer substrate mounted on a circuit board, a method for mounting the multilayer substrate, and a method for manufacturing the multilayer substrate.

A multilayer substrate according to a preferred embodiment of the present invention includes a plurality of resin substrates, a bonding layer between resin substrates adjacent to each other in a lamination direction in which the plurality of resin substrates are laminated, and a plurality of conductor patterns on both surfaces of the plurality of resin substrates, and including a surface defined by a plated film. The plurality of resin substrates include a first resin substrate including a first surface and a second surface opposite to the first surface, and a second resin substrate including a third surface facing the second surface and a fourth surface opposite to the third surface. The plurality of conductor patterns include a first conductor pattern disposed on the first surface and including a surface defined by a plated film, a second conductor pattern disposed on the second surface and including a surface defined by a plated film, a third conductor pattern disposed on the third surface and including a surface defined by a plated film, and a fourth conductor pattern disposed on the fourth surface and including a surface defined by a plated film. The first conductor pattern does not face other conductor patterns and is located closer to one outermost layer than the second conductor pattern is. The plated film of the second conductor pattern is thinner than the plated film of the first conductor pattern. A plurality of layers including the first resin substrate, the bonding layer, and the second resin substrate are laminated and thermally bonded together.

The thick first conductor pattern located closer to the outermost layer facilitates heat transfer to the inside of the lamination body through the first conductor pattern having high thermal conductivity. This structure thus reduces the amount of heat from a hot press machine required to bond the inner layers and is thus able to relatively reduce the amount of heat provided to a resin substrate located closer to the outermost layer. This structure reduces or prevents deformation (thermal deformation) involving resin flow.

In this structure, no conductor pattern is located closer to the outermost surface (upper surface or mount surface) than the first resin substrate is. Thus, thickening a conductor pattern on the first surface does not cause a short circuit between the conductor pattern and a conductor facing the conductor pattern in the lamination direction. In addition, the conductor pattern on the second surface is relatively thin. This structure reduces a risk of a short circuit between the conductor pattern on the second surface and the conductor pattern facing the conductor pattern on the second surface with the bonding layer interposed therebetween. Therefore, this structure further reduces a risk of a short circuit than a structure in which all of the plurality of conductor patterns include plated films with the same thickness and a multilayer substrate has the same lamination thickness. For the same or similar reason, the lamination thickness of the multilayer substrate is able to be reduced. In addition, this structure provides a multilayer substrate including conductor patterns of lower resistance compared to a structure in which all of the plurality of conductor patterns include thin plated films.

The bonding layer preferably has higher fluidity at a predetermined pressing temperature than the plurality of resin substrates. Even when the bonding layer is more likely to flow at the pressing temperature, this structure prevents a short circuit between the layers due to thermal deformation in the pressing.

The plated film of the third conductor pattern is preferably thinner than the plated film of the fourth conductor pattern. This structure prevents the conductor patterns from coming into contact with each other even when the second surface and the third surface are located close to each other, and thus enables a reduction in height.

At least a portion of the plurality of conductor patterns is preferably embedded in the resin substrate. In this structure, a portion of the conductor pattern embedded in the resin substrate (specifically, thickness of the resin substrate) also defines and functions as a thickness of the plated film. Thus, when the conductor patterns adjacent to each other in the lamination direction are spaced a uniform distance apart, the cross-sectional areas of the conductor patterns are increased accordingly. When the conductor patterns have the same or substantially the same cross-sectional area, the conductor patterns adjacent to each other in the lamination direction are able to be spaced a larger distance apart.

The first conductor pattern, the second conductor pattern, the third conductor pattern, and the fourth conductor pattern preferably include a base made of metal foil and the plated film is thicker than the base. Thus, a base electrode is able to provide a narrowly pitched conductor pattern (with a small distance between centers of adjacent conductor patterns) by, for example, photolithography. The plated film grows into a conductor pattern with a high aspect ratio in the thickness direction. Thus, the conductor pattern is narrowly pitched, whereas the conductor pattern has a large cross-sectional area, and the resistance per unit length is able to be effectively reduced. Furthermore, the difference in thickness between plated films becomes more remarkable as the plated films have a larger thickness. The above-described structure according to a preferred embodiment of the present invention prevents a short circuit even when the plated films have large thickness.

The metal foil is preferably copper foil and the plated film is a copper-plated film. This structure is able to easily provide a conductor pattern having high electric conductivity and low resistance per unit length.

Preferably, the plurality of conductor patterns include one or more conductor patterns with thick plated films and one or more conductor patterns with thin plated films, which are provided in accordance with surfaces on which the conductor patterns are provided. Of the plurality of conductor patterns, conductor patterns facing each other with the bonding layer interposed therebetween include portions overlapping in a plan view, and define a pair of the conductor pattern with a thin plated film and the conductor pattern with a thick plated film, or a pair of the conductor pattern with a thin plated film and the conductor pattern with a thin plated film. In this structure, the conductor patterns with thick plated films do not face each other in the lamination direction, and a short circuit between the conductor patterns with thick plated films is prevented. Furthermore, when the conductor patterns with thin plated films face each other, a margin (distance) between the layers is able to be reduced (the conductor patterns are able to be located closer) since the plated films have a small difference in thickness. Thus, the lamination body is able to be reduced in thickness, accordingly.

The first conductor pattern and the third conductor pattern are preferably the conductor patterns with thick plated films, and the second conductor pattern and the fourth conductor pattern are preferably the conductor patterns with thin plated films. The second resin substrate is preferably located closer to a mount surface than the first resin substrate is.

The second conductor pattern is preferably arranged at a uniform pitch in a cross section taken in the lamination direction, and the third conductor pattern is preferably arranged at a uniform pitch in the cross section and displaced from the second conductor pattern in a direction of the pitch. In this structure, the thickest portions of the second conductor pattern and the third conductor pattern face each other in a direction inclined from the lamination direction (in an oblique direction). Thus, the second conductor pattern and the third conductor pattern are prevented from causing a short circuit even when the second surface and the third surface are narrowly spaced.

The conductor pattern is preferably a coil conductor pattern. In this structure, the coil conductor patterns are arranged at a narrow pitch. Thus, high thermal conductivity is obtained, and the advantageous effect of the present invention is significantly achieved.

The multilayer substrate preferably further includes a terminal electrode disposed on a mount surface of a lamination body including the plurality of resin substrates and the bonding layer laminated together, the mount surface being located closer to the second resin substrate than to the first resin substrate. In this structure, the first conductor pattern and the second conductor pattern are effectively prevented from causing a short circuit when a surface close to the first resin substrate is heated and pressed to mount the multilayer substrate on a circuit board.

The terminal electrode is preferably disposed at a position at which the terminal electrode does not overlap the conductor pattern in a plan view. This structure prevents the conductor patterns overlapping the terminal electrode in a plan view from receiving a local pressure when the plurality of resin substrates of the multilayer substrate are laminated and hot-pressed or when the multilayer substrate is mounted on a circuit board. This structure is able to avoid a local short circuit.

A structure of a multilayer substrate mounted on a circuit board according to a preferred embodiment of the present invention includes a multilayer substrate according to a preferred embodiment of the present invention, and a circuit board on which the multilayer substrate is mounted, and the terminal electrode is connected to a pad electrode of the circuit board.

In this structure, the first conductor pattern, which is a conductor located closer to the surface near the first resin substrate, has a large surface area, and thus thermal conductivity in heating the lamination body is high. To mount the multilayer substrate on a circuit board, the surface of the multilayer substrate near the first resin substrate is heated with, for example, a hot bar, and the heat is quickly transferred to a bonding material, such as solder, at the terminal electrode, so that the multilayer substrate is able to be efficiently mounted.

A method for mounting a multilayer substrate on a circuit board according to a preferred embodiment of the present invention is a method for mounting a multilayer substrate according to a preferred embodiment of the present invention on a circuit board, and a surface of the multilayer substrate opposite to a surface on which the terminal electrode is disposed is heated with a hot bar to connect the terminal electrode to a pad electrode provided on the circuit board.

With the above-described method, the heat of the hot bar is quickly transferred to a bonding material, such as solder, at the terminal electrode, so that the multilayer substrate can be efficiently mounted.

A method for manufacturing a multilayer substrate according to a preferred embodiment of the present invention includes a base pattern forming step of forming base patterns on a first surface and a second surface, opposite to the first surface, of a thermoplastic first resin substrate by patterning copper foil, each of the base patterns defining the same or substantially the same plane and having the same or substantially the same thickness, and forming base patterns on a third surface, facing the second surface, and a fourth surface, opposite to the third surface, of a thermoplastic second resin substrate by patterning copper foil, each of the base patterns defining the same or substantially the same plane and having the same or substantially the same thickness, a plating step of growing a copper-plated film on the base pattern of the first surface, growing a copper-plated film on the base pattern of the second surface, growing the copper-plated film on the base pattern of the first surface more thickly than the copper-plated film on the base pattern of the second surface, growing a copper-plated film on the base pattern of the third surface, growing a copper-plated film on the base pattern of the fourth surface, and growing the copper-plated film on the base pattern of the fourth surface more thickly than the copper-plated film on the base pattern of the third surface, and a lamination body forming step of holding a bonding layer including no conductor pattern between the second surface of the first resin substrate and the third surface of the second resin substrate, and laminating and thermocompression-bonding together a plurality of layers including the first resin substrate, the bonding layer, and the second resin substrate while locating a conductor pattern closer to one outermost layer, the conductor pattern formed of the base pattern on the first surface and the copper-plated film formed on the base pattern.

With the above-described method, a conductor located closer to the outermost surface (upper surface) has a large surface area and thermal conductivity in heating the lamination body is high. Thus, the entirety of the lamination body is more quickly heated in hot pressing, and such a phenomenon that a layer located near the outermost surface is softened to flow earlier is prevented. This structure prevents layers from being disposed excessively close to each other due to unevenness of the plated films, and thus prevents a short circuit between the layers.

According to preferred embodiments of the present invention, multilayer substrates that prevent conductor patterns each including a plated film deposited thereon from causing a short circuit in the lamination direction, and a structure of the multilayer substrates mounted on circuit boards is able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A plurality of preferred embodiments of the present invention are described below with reference to the drawings. Throughout the drawings, the same components are denoted with the same reference signs. For the purposes of illustration of main points or for ease of understanding, preferred embodiments are separately described. However, some components described in different preferred embodiments may be replaced with others or combined together. The second preferred embodiment and the following preferred embodiments are described on only the points different from those of the first preferred embodiment and not on the same points. Particularly, the same or similar advantageous effects obtained in the same structures are not described in every preferred embodiment.

First Preferred Embodiment

Figure 1:
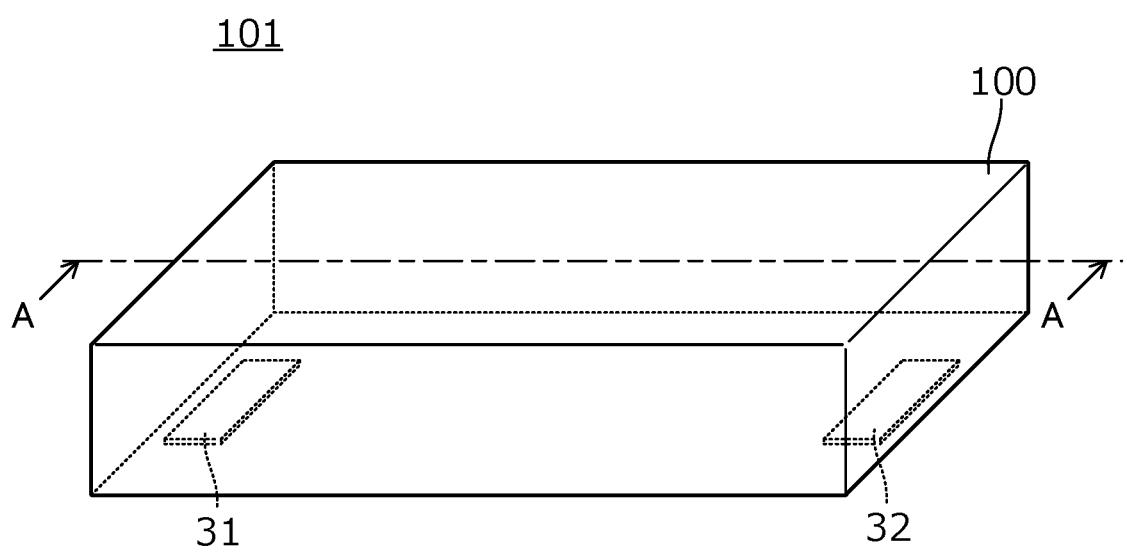
FIG. 1 is a perspective view of a multilayer substrate according to a first preferred embodiment of the present invention.

FIG. 1 is a perspective view of a multilayer substrate 101 according to a first preferred embodiment. The multilayer substrate 101 includes a lamination body 100, including a plurality of resin substrates and a bonding layer between the resin substrates adjacent to each other in a lamination direction of the plurality of resin substrates. Surface-mount terminal electrodes 31 and 32 are disposed on the undersurface of the multilayer substrate 101 in the direction illustrated in FIG. 1.

Figure 2A:
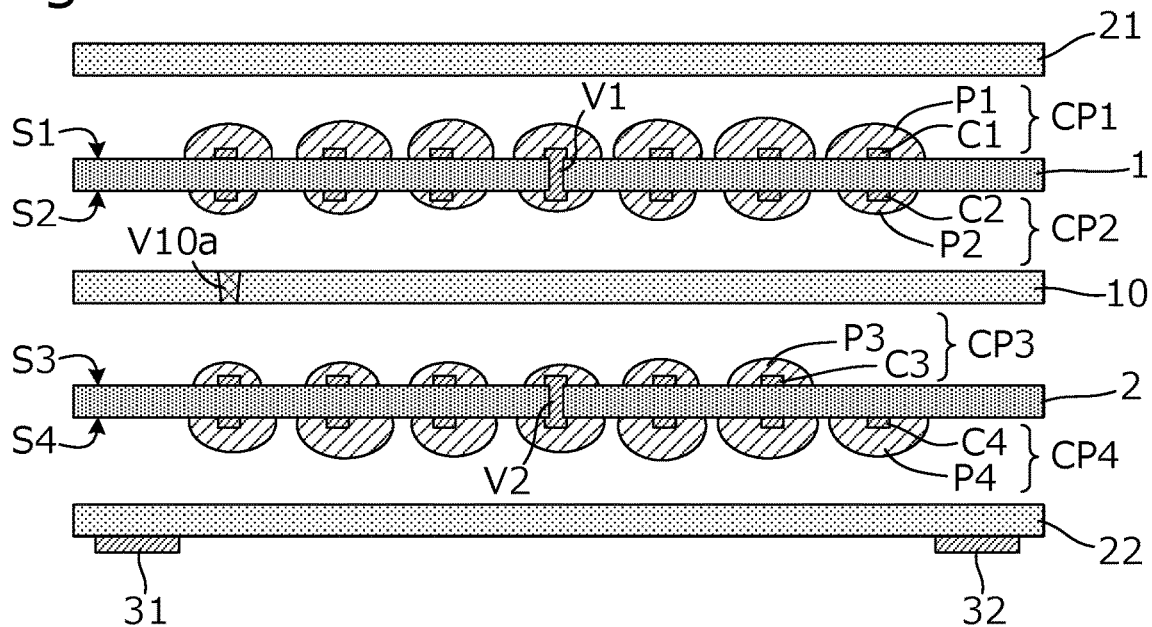
FIG. 2A is a sectional view of a plurality of resin substrates and a bonding layer of the multilayer substrate shown in FIG. 1, before being laminated together.
Figure 2B:
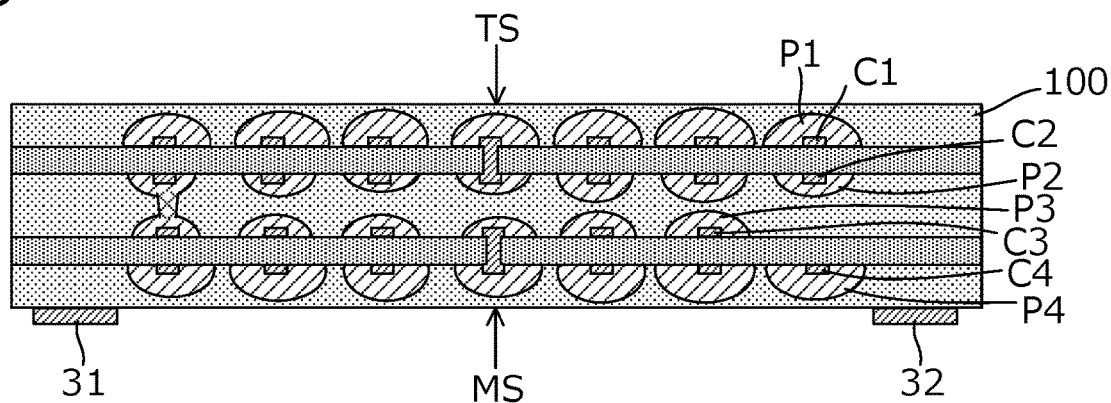
FIG. 2B is a sectional view of the plurality of resin substrates and the bonding layer after being laminated together.
Figure 2C:
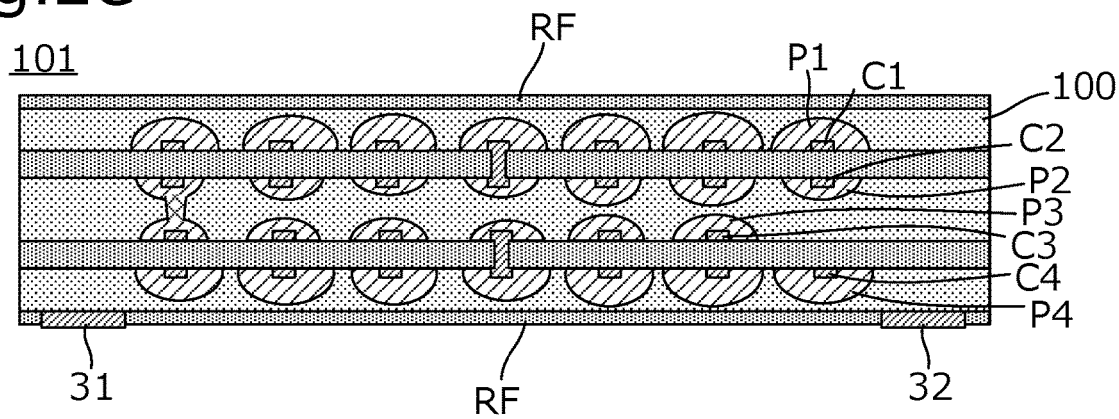
FIG. 2C is a sectional view of the multilayer substrate taken along line A-A in FIG. 1.
Figure 3:
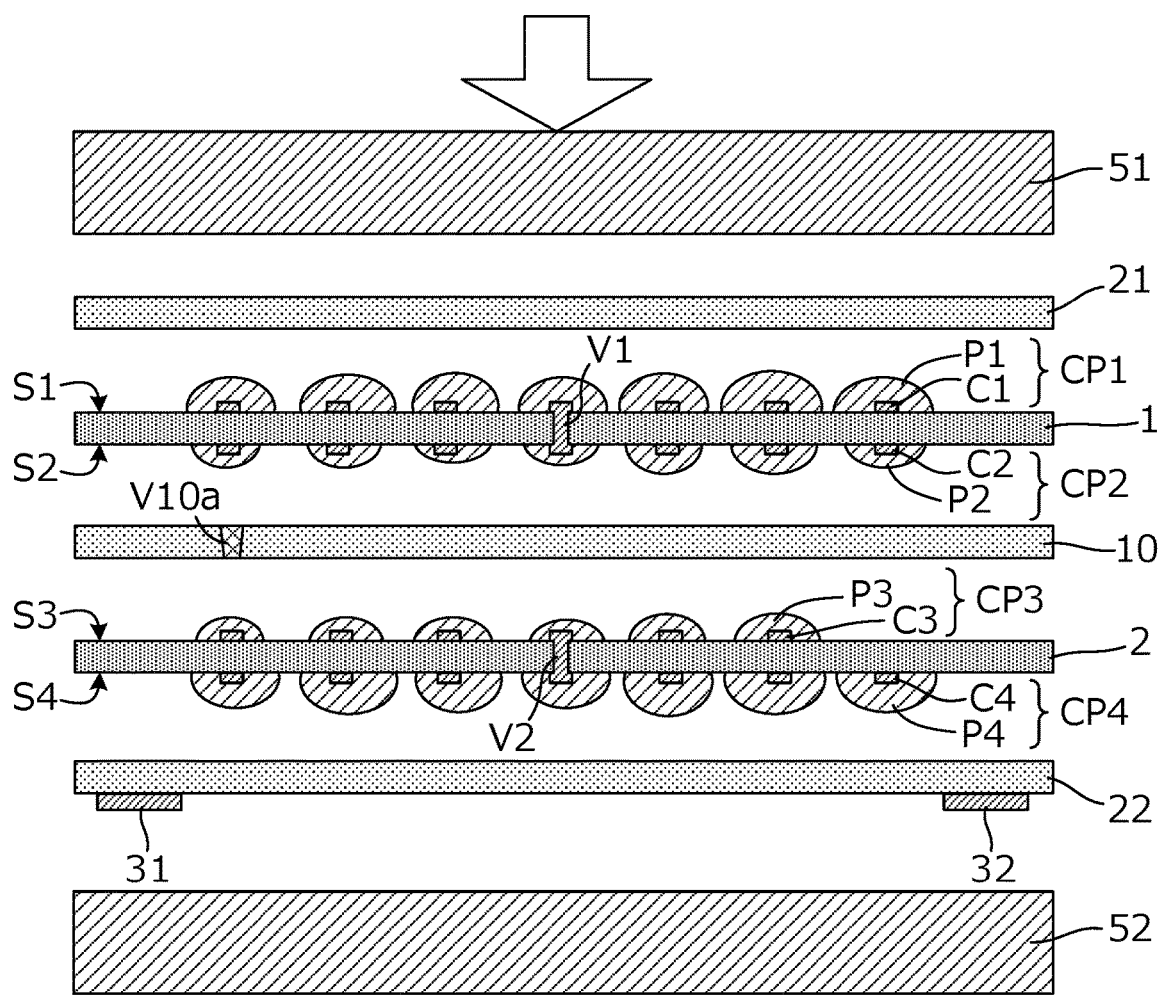
FIG. 3 is a sectional view of the multilayer substrate during lamination.
Figure 4:
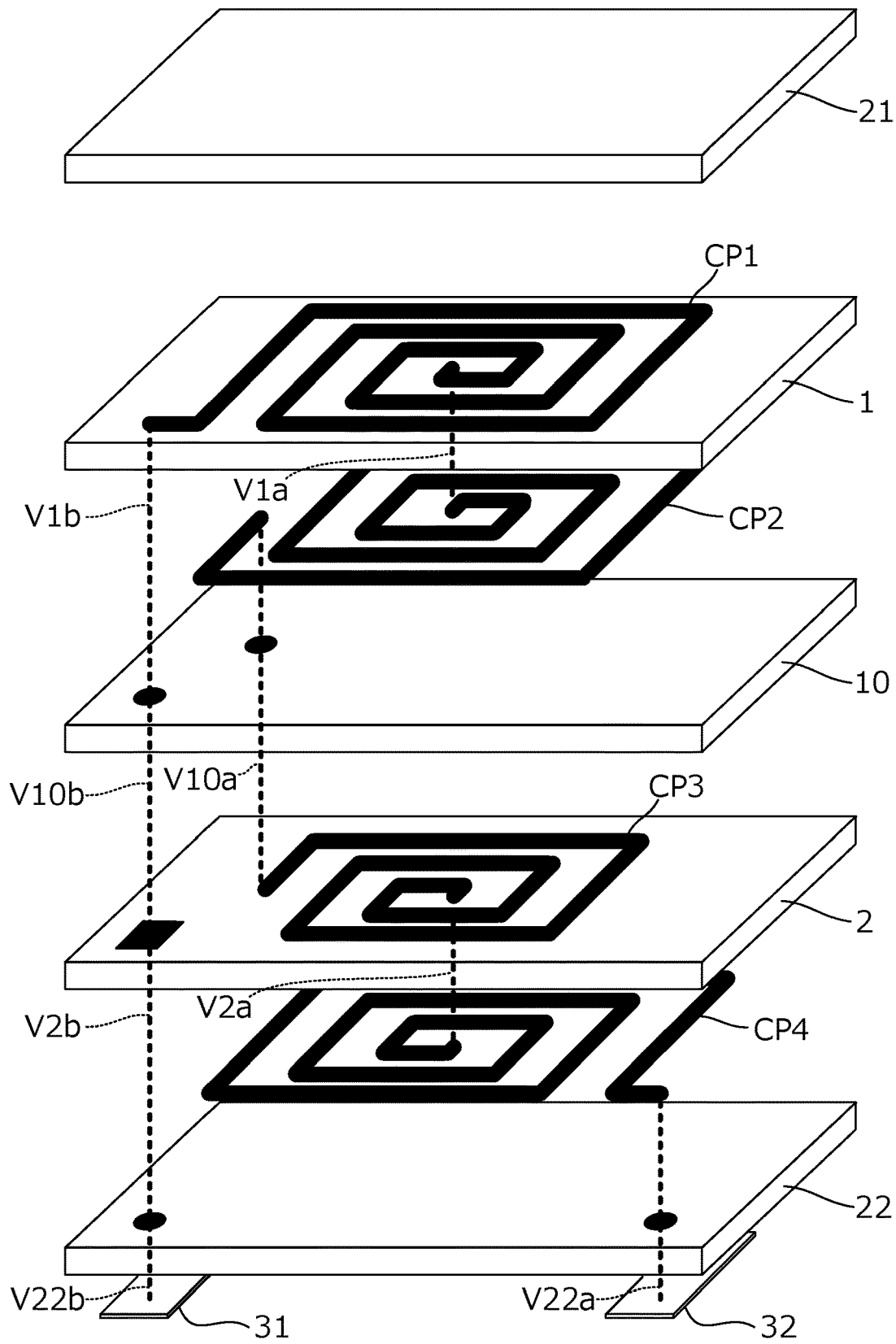
FIG. 4 is an exploded perspective view of the multilayer substrate shown in FIG. 1.

FIG. 2A is a sectional view of the plurality of resin substrates and the bonding layer of the multilayer substrate 101, before being laminated together. FIG. 2B is a sectional view of the resin substrates and the bonding layer after being laminated together. FIG. 2C is a sectional view of the multilayer substrate 101 taken along line A-A in FIG. 1. FIG. 3 is a sectional view of the multilayer substrate 101 during lamination. For convenience of illustration of reference signs, the resin substrates and the bonding layer are separate in the illustration. FIG. 4 is an exploded perspective view of the multilayer substrate 101.

The multilayer substrate 101 includes resin substrates 1 and 2, a bonding layer 10, and cover layers (or coverlays) 21 and 22. Here, the resin substrate 1 corresponds to a "first resin substrate", and the resin substrate 2 corresponds to a "second resin substrate". A first conductor pattern CP1 is disposed on a first surface S1 of the first resin substrate 1, and a second conductor pattern CP2 is disposed on a second surface S2 of the first resin substrate 1. A third conductor pattern CP3 is disposed on a third surface S3 of the second resin substrate 2, and a fourth conductor pattern CP4 is disposed on a fourth surface S4 of the second resin substrate 2.

The first conductor pattern CP1 includes a base conductor pattern C1 and a plated film P1 disposed on the surface of the base conductor pattern C1. The second conductor pattern CP2 includes a base conductor pattern C2 and a plated film P2 disposed on the surface of the base conductor pattern C2. Similarly, the third conductor pattern CP3 includes a base conductor pattern C3 and a plated film P3 disposed on the surface of the base conductor pattern C3. The fourth conductor pattern CP4 includes a base conductor pattern C4 and a plated film P4 disposed on the surface of the base conductor pattern C4. These conductor patterns CP1, CP2, CP3, and CP4 define a single or a plurality of coil conductor patterns.

The base conductor patterns C1, C2, C3, and C4 are preferably formed by patterning, for example, copper foil. The plated films P1, P2, P3, and P4 are preferably, for example, copper-plated films. These plated films P1, P2, P3, and P4 are thicker than the base conductor patterns C1, C2, C3, and C4.

The first conductor pattern CP1 is located closer to one of the outermost layers (cover lay 21 in this example) than the second conductor pattern CP2 is. The second conductor pattern CP2 is thinner than the first conductor pattern CP1. The third conductor pattern CP3 is thinner than the fourth conductor pattern CP4. The second conductor pattern CP2 and the third conductor pattern CP3 at least partially overlap each other in a plan view.

An interlayer connection conductor V1, which connects the first conductor pattern CP1 and the second conductor pattern CP2 to each other, is located at a predetermined position of the first resin substrate 1. Similarly, an interlayer connection conductor V2, which connects the third conductor pattern CP3 and the fourth conductor pattern CP4 to each other, is located at a predetermined position of the second resin substrate 2. An interlayer connection conductor V10a is located at a predetermined position of the bonding layer 10.

The cover layers 21 and 22 and the bonding layer 10 are thermosetting resin sheets preferably made of, for example, epoxy resin. The first resin substrate 1 and the second resin substrate 2 are thermoplastic resin sheets preferably made of, for example, a liquid crystal polymer. The cover layers 21 and 22 and the bonding layer 10 have higher fluidity at a predetermined pressing temperature than the first resin substrate 1 and the second resin substrate 2.

As illustrated in FIG. 2A, the bonding layer 10 is disposed between the first resin substrate 1 including the first conductor pattern CP1 and the second conductor pattern CP2 provided thereon and the second resin substrate 2 including the third conductor pattern CP3 and the fourth conductor pattern CP4 provided thereon. The cover layer 21 is disposed on the outer layer side of the first resin substrate 1, and the cover layer 22 is disposed on the outer layer side of the second resin substrate 2.

As illustrated in FIG. 3, the layers disposed between press plates 51 and 52 to be hot-pressed at a predetermined temperature and a predetermined pressure are formed into a lamination body 100, as illustrated in FIG. 2B. The cover layers 21 and 22 and the bonding layer 10 have higher fluidity at the pressing temperature than the first resin substrate 1 and the second resin substrate 2. Thus, the bonding layer 10 is filled between the first resin substrate 1 and the second resin substrate 2, the cover layer 21 is filled on the surface (upper surface) of the first resin substrate 1, and the cover layer 22 is filled on the surface (lower surface) of the second resin substrate 2.

As illustrated in FIG. 2C, resist films RF are disposed on the surfaces of the lamination body 100 as required.

FIG. 4 illustrates the second conductor pattern CP2 separated from the lower surface of the first resin substrate 1. Similarly, FIG. 4 illustrates the fourth conductor pattern CP4 separated from the lower surface of the second resin substrate 2.

Interlayer connection conductors V1a and V1b are disposed in the first resin substrate 1. Interlayer connection conductors V2a and V2b are disposed in the second resin substrate 2. Interlayer connection conductors V10a and V10b are disposed in the bonding layer 10. Interlayer connection conductors V22a and V22b are disposed in the cover lay 22.

The first conductor pattern CP1, the second conductor pattern CP2, the third conductor pattern CP3, and the fourth conductor pattern CP4 are preferably coil conductor patterns having a rectangular or substantially rectangular spiral shape, for example. The inner terminal of the first conductor pattern CP1 and the inner terminal of the second conductor pattern CP2 are connected together with the interlayer connection conductor Via. The outer terminal of the second conductor pattern CP2 and the outer terminal of the third conductor pattern CP3 are connected together with the interlayer connection conductor V10a. The inner terminal of the third conductor pattern CP3 and the inner terminal of the fourth conductor pattern CP4 are connected together with the interlayer connection conductor V2a. The outer terminal of the fourth conductor pattern CP4 and the terminal electrode 32 are connected together with the interlayer connection conductor V22a. The outer terminal of the first conductor pattern CP1 and the terminal electrode 31 are connected together with interlayer connection conductors V1b, V10b, V2b, and V22b.

The terminal electrodes 31 and 32 are located at positions at which they do not overlap the coil conductor patterns in a plan view.

Figure 5:
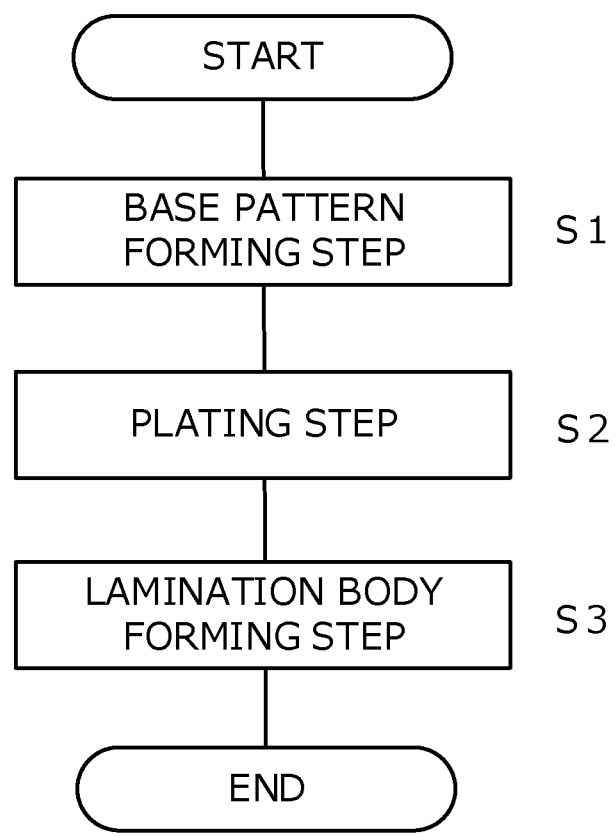
FIG. 5 is a flowchart of the process for manufacturing the multilayer substrate shown in FIG. 1.

FIG. 5 is a flowchart of the procedure of manufacturing the multilayer substrate 101 according to the present preferred embodiment. As will be described below, the multilayer substrate 101 is manufactured by being processed in a base pattern forming step S1, a plating step S2, and a lamination body forming step S3 in this order.

Base Pattern Forming Step S1

Base patterns are formed by photolithography on the first resin substrate 1 including copper foil attached to both surfaces thereof. Holes are formed at positions at which the interlayer connection conductors V1 and V2 illustrated in FIG. 2A are to be formed. The copper foil is formed into the base patterns. Thus, each base pattern is located on substantially the same plane and has the same thickness.

Plating Step S2

Copper plated films are deposited on the base patterns by electroplating. In the plating step S2, the plating bath time period is controlled to form each conductor pattern having a predetermined plating thickness. For example, firstly, a resist film is formed on the second surface S2 of the first resin substrate 1, and the first resin substrate 1 in this state is bathed in the plating bath for a first predetermined time period. Thus, a plated film having a predetermined thickness is formed on the first surface S1 of the first resin substrate 1. Subsequently, the resist film is removed and the first resin substrate 1 is bathed in the plating bath for a second predetermined time period. Thus, a plated film P2 having a thickness corresponding to the second predetermined time period is formed on the second surface S2 of the first resin substrate 1, and a plated film P1 having a thickness corresponding to the sum of the first predetermined time period and the second predetermined time period is formed on the first surface S1 of the first resin substrate 1. Similarly, plated films P3 and P4 having different thickness are formed on the second resin substrate 2.

In the plating step S2, plated films are formed in the holes at which the interlayer connection conductors V1 and V2 are to be formed, so that the interlayer connection conductors V1 and V2 are formed.

Another example of plating other than the one described above is to bathe the resin substrate in the plating bath to form plated films of a predetermined thickness on both surfaces thereof, dispose a resist film on the surface that is to have a thin plated film, and further grow the plated film on the surface having no resist film. Another example is to dispose a resist film on a first surface, form a plated film of a predetermined thickness on a second surface, remove the resist film on the first surface, form a resist film on the second surface, and form a plated film of a predetermined thickness on the first surface.

Lamination Body Forming Step S3

As illustrated in FIG. 2A, the cover layer 22, the second resin substrate 2, the bonding layer 10, the first resin substrate 1, and the cover layer 21 are laminated in this order and hot-pressed at a predetermined temperature and a predetermined pressure. For example, they are preferably pressed at a temperature not less than about 280° C. and not more than about 320° C. Thus, the lamination body 100 illustrated in FIG. 2B is formed. Thereafter, the resist films RF are applied to the surfaces of the lamination body 100.

As in the present preferred embodiment, when the interlayer connection conductor V10a is formed in the bonding layer 10, it is formed before the lamination body forming step S3. For example, a hole is formed at a predetermined position of the bonding layer 10, a protection sheet is bonded to one surface of the bonding layer 10, the hole is filled with an electroconductive paste, and the protection sheet is removed. Thus, the bonding layer 10 including the electroconductive paste disposed in the hole is formed. In the lamination body forming step, the electroconductive paste is solidified into an interlayer connection conductor.

The present preferred embodiment has the following advantageous effects.

No conductor pattern is disposed beyond the upper surface of the first resin substrate 1. Thus, even when the first conductor pattern CP1 is thick, no short circuit between the first conductor pattern CP1 and a conductor facing the first conductor pattern CP1 in the lamination direction occurs.

The first conductor pattern CP1 has a large surface area. Thus, when the multilayer substrate 101 is mounted on a circuit board, thermal conductivity in heating the multilayer substrate 101 is high. When the multilayer substrate is mounted on a circuit board, a surface of the multilayer substrate closer to the first resin substrate is heated with, for example, a hot bar. The heat is immediately transferred to a bonding material, such as solder, at the terminal electrodes to efficiently mount the multilayer substrate. Furthermore, the layer closer to the outermost layer is prevented from being softened to flow earlier than other layers to prevent a short circuit between the second conductor pattern and the third conductor pattern.

The interlayer connection conductor thermally connects the first conductor pattern to a conductor pattern on a layer located farther inward than the first conductor pattern. Thus, thermal conduction from the first conductor pattern to the inner layers is facilitated, the temperature distribution between the outer layers and the inner layers of the lamination body is reduced, and the entirety thereof is laminated and compression-bonded together while a resin flow near the outer layer is reduced or prevented. Furthermore, the multilayer substrate is able to be quickly mounted on a circuit board. Particularly, when the conductor patterns are coil conductor patterns, interlayer connection conductors are provided, and a heat conduction effect with the interlayer connection conductors is high.

The second conductor pattern CP2 is relatively thin, and thus it is less likely to be short-circuited with the third conductor pattern CP3, facing second conductor pattern CP2 with the bonding layer 10 interposed therebetween. Therefore, this structure further reduces a risk of a short circuit than a structure in which all of the plurality of conductor patterns include plated films with the same thickness and a multilayer substrate has the same lamination thickness. For the same reason, the lamination thickness of the multilayer substrate is able to be reduced. The multilayer substrate also includes conductor patterns with low resistance compared to the structure in which all of the plurality of conductor patterns include thin plated films.

The plated films P1, P2, P3, and P4 are thicker than the base conductor patterns C1, C2, C3, and C4. The conductor patterns thus have larger cross-sectional areas and are able to effectively reduce the resistance per unit length. Furthermore, plated films having larger thickness have a larger thickness variation. The present preferred embodiment with the above-described structure prevents a short circuit while having a thick plated film.

The second conductor pattern CP2 and the third conductor pattern CP3 are both thin. Thus, their plated films have small unevenness and layers are able to be located close to each other, so that the lamination body has a small thickness.

Preferably, the base conductor pattern is copper foil, and the plated film is a copper-plated film, for example. Thus, a conductor pattern having low resistance per unit length is easily provided.

In the multilayer substrate 101 according to the present preferred embodiment, thick, thin, thin, and thick plated films of the conductor pattern, for example, are preferably arranged in this order from above in FIG. 2C. The present invention is not limited to this structure. As illustrated in FIG. 3, it suffices that the plated film P2 of the second conductor pattern CP2 is thinner than the plated film P1 of the first conductor pattern CP1 when only the press plate 51 is heated and the facing press plate 52 is not heated in hot pressing. Thus, for example, thick, thin, thick, and thin plated films may be alternatively arranged in this order.

Second Preferred Embodiment

Figure 6:
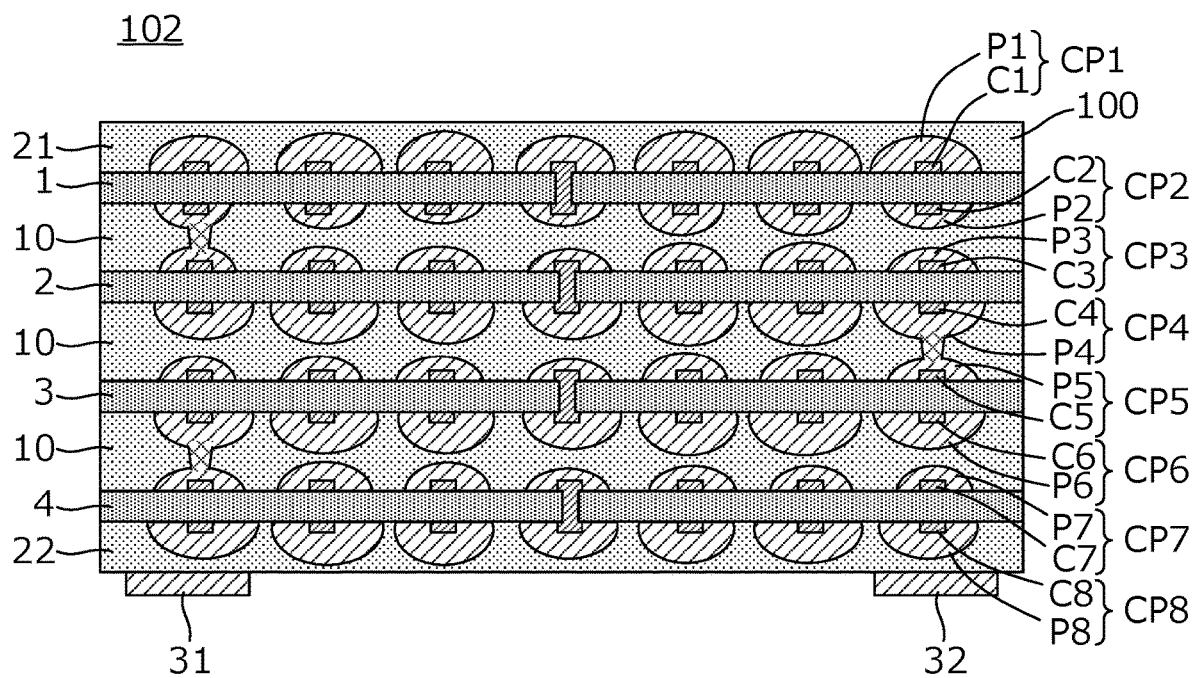
FIG. 6 is a sectional view of a multilayer substrate according to a second preferred embodiment of the present invention.

FIG. 6 is a sectional view of a multilayer substrate 102 according to a second preferred embodiment of the present invention. The multilayer substrate 102 includes four resin substrates 1, 2, 3, and 4 each including conductor patterns on both surfaces thereof.

A plurality of conductor patterns include a thick conductor pattern and a thin conductor pattern provided in accordance with the surfaces on which the conductor patterns are provided. Facing ones of the plurality of conductor patterns with the bonding layer 10 interposed therebetween include portions overlapping in a plan view, and define a pair of a thin conductor pattern and a thick conductor pattern or a pair of thin conductor patterns.

In the example illustrated in FIG. 6, the second conductor pattern CP2 is thinner than the first conductor pattern CP1, and the third conductor pattern CP3 is thinner than the fourth conductor pattern CP4. The fifth conductor pattern CP5 is thinner than the sixth conductor pattern CP6, and the seventh conductor pattern CP7 is thinner than the eighth conductor pattern CP8. Thus, the second conductor pattern CP2 and the third conductor pattern CP3 facing each other with the bonding layer 10 interposed therebetween define a pair of thin conductor patterns. The fourth conductor pattern CP4 and the fifth conductor pattern CP5 facing each other with the bonding layer 10 interposed therebetween define a pair of a thick conductor pattern and a thin conductor pattern. The sixth conductor pattern CP6 and the seventh conductor pattern CP7 facing each other with the bonding layer 10 interposed therebetween define a pair of a thick conductor pattern and a thin conductor pattern.

In this structure, thick conductor patterns do not face each other in the lamination direction, and a short circuit between the thick conductor patterns is prevented.

In manufacturing the multilayer substrate 102, the conductors located close to the outermost surfaces (upper surface and lower surface in FIG. 6) preferably have a large surface area, and thus thermal conductivity in heating the lamination body is high. Thus, the entirety of the lamination body is more quickly heated in hot pressing, and the layer closer to the outermost layer is prevented from being softened to flow earlier. Thus, the conductor patterns are prevented from moving toward each other due to uneven softening flow in the lamination direction.

Figure 7:
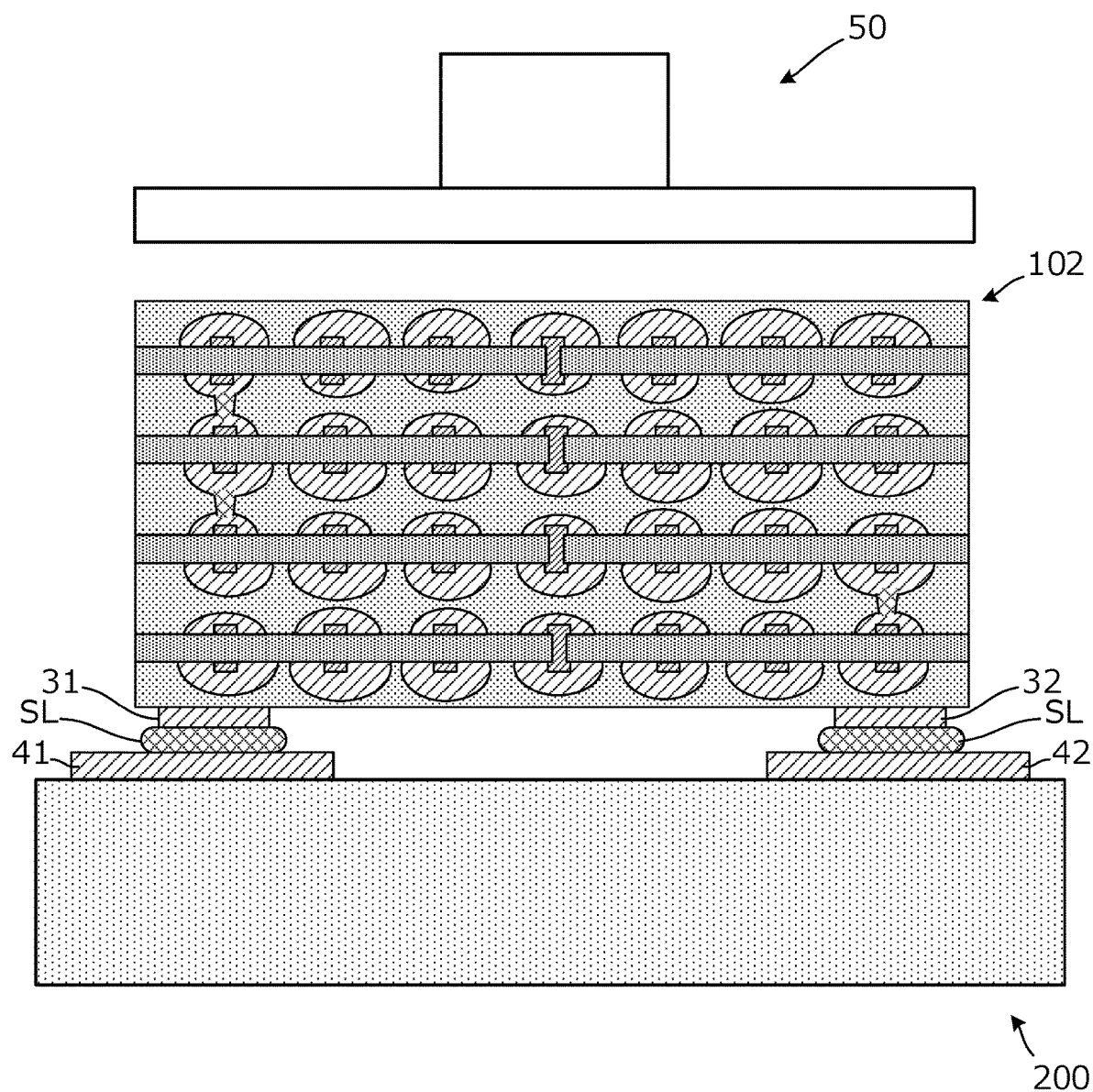
FIG. 7 illustrates a structure of the multilayer substrate shown in FIG. 6 mounted on a circuit board and a method for mounting the multilayer substrate.

FIG. 7 illustrates a structure of a multilayer substrate mounted on a circuit board and a method for mounting a multilayer substrate according to a preferred embodiment of the present invention. Pad electrodes 41 and 42 are disposed on a circuit board 200 and include solder paste SL printed on their surfaces. The multilayer substrate 102 is mounted on the circuit board 200 with the terminal electrodes 31 and 32 facing the pad electrodes 41 and 42. A surface of the multilayer substrate 102 opposite to a surface on which the terminal electrodes 31 and 32 are disposed is heated and pressed with a hot bar 50. The terminal electrodes 31 and 32 are then soldered to the pad electrodes 41 and 42.

As described above, the first conductor pattern CP1 has a large surface area, and thus thermal conductivity in heating the lamination body 100 is high. Thus, the heat of the hot bar 50 is quickly transferred to the solder at the terminal electrodes 31 and 32 to efficiently mount the multilayer substrate 102.

In the multilayer substrate 102 according to the present preferred embodiment, thick, thin, thin, thick, thin, thick, thin, and thick conductor patterns, for example, are preferably arranged in this order from above in FIG. 6. Alternatively, thick, thin, thick, thin, thick, thin, thick, and thick conductor patterns may be arranged in this order, or thick, thin, thick, thick, thin, thick, thin, and thick conductor patterns may be arranged in this order.

Third Preferred Embodiment

Figure 8:
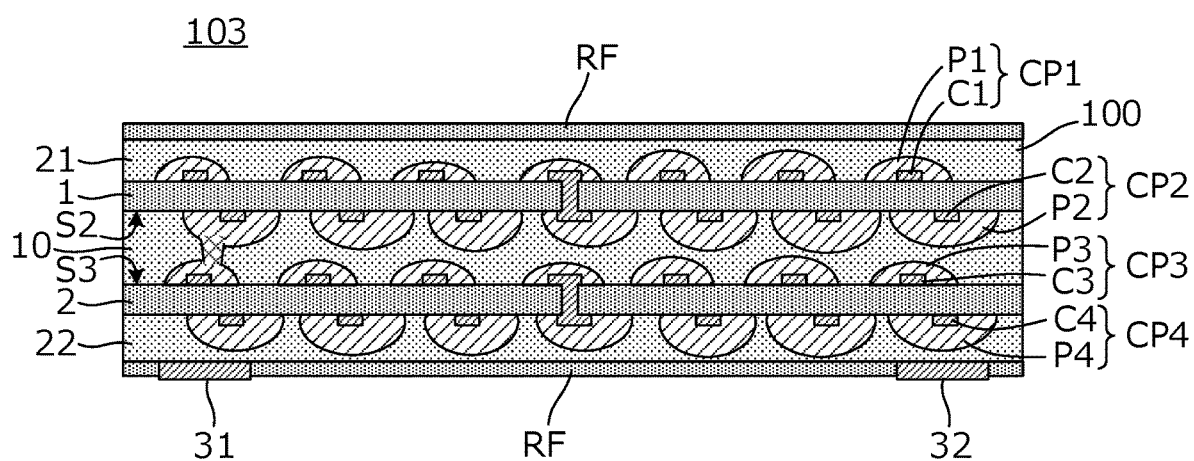
FIG. 8 is a sectional view of a multilayer substrate according to a third preferred embodiment of the present invention.

FIG. 8 is a sectional view of a multilayer substrate 103 according to a third preferred embodiment of the present invention. The multilayer substrate 103 includes a lamination body 100 including a first resin substrate 1, a second resin substrate 2, a bonding layer 10, and cover layers 21 and 22. Resist films RF are disposed on the surfaces of the lamination body 100.

The multilayer substrate 103 differs from the multilayer substrate 101 according to the first preferred embodiment in the positions of the conductor patterns CP1, CP2, CP3, and CP4. The other components of the multilayer substrate 103 are the same or substantially the same as those of the multilayer substrate 101 according to the first preferred embodiment.

In the multilayer substrate 103, the first conductor pattern CP1, the second conductor pattern CP2, the third conductor pattern CP3, and the fourth conductor pattern CP4 are arranged at a constant pitch in cross section taken in the lamination direction. The second conductor pattern CP2 is displaced from the third conductor pattern CP3 in the pitch direction. Specifically, the thickest portion (apex portion) of the second conductor pattern CP2 and the thickest portion (apex portion) of the third conductor pattern CP3 do not overlap in a plan view. In other words, for example, the second conductor pattern CP2 preferably having a rectangular or substantially rectangular spiral shape and the third conductor pattern CP3 preferably having a rectangular or substantially rectangular spiral shape negligibly overlap each other in a plan view in the directions in which they are wounded. For example, the rate of the overlapped portion is preferably, for example, smaller than or equal to about 10%.

In this structure, the thickest portions of the second conductor pattern CP2 and the third conductor pattern CP3 are spaced apart from each other and face each other in a direction inclined from the lamination direction (in an oblique direction). Thus, a short circuit between the second conductor pattern CP2 and the third conductor pattern CP3 is prevented even when the second surface S2 and the third surface S3 are spaced a smaller distance apart.

Fourth Preferred Embodiment

Figure 9:
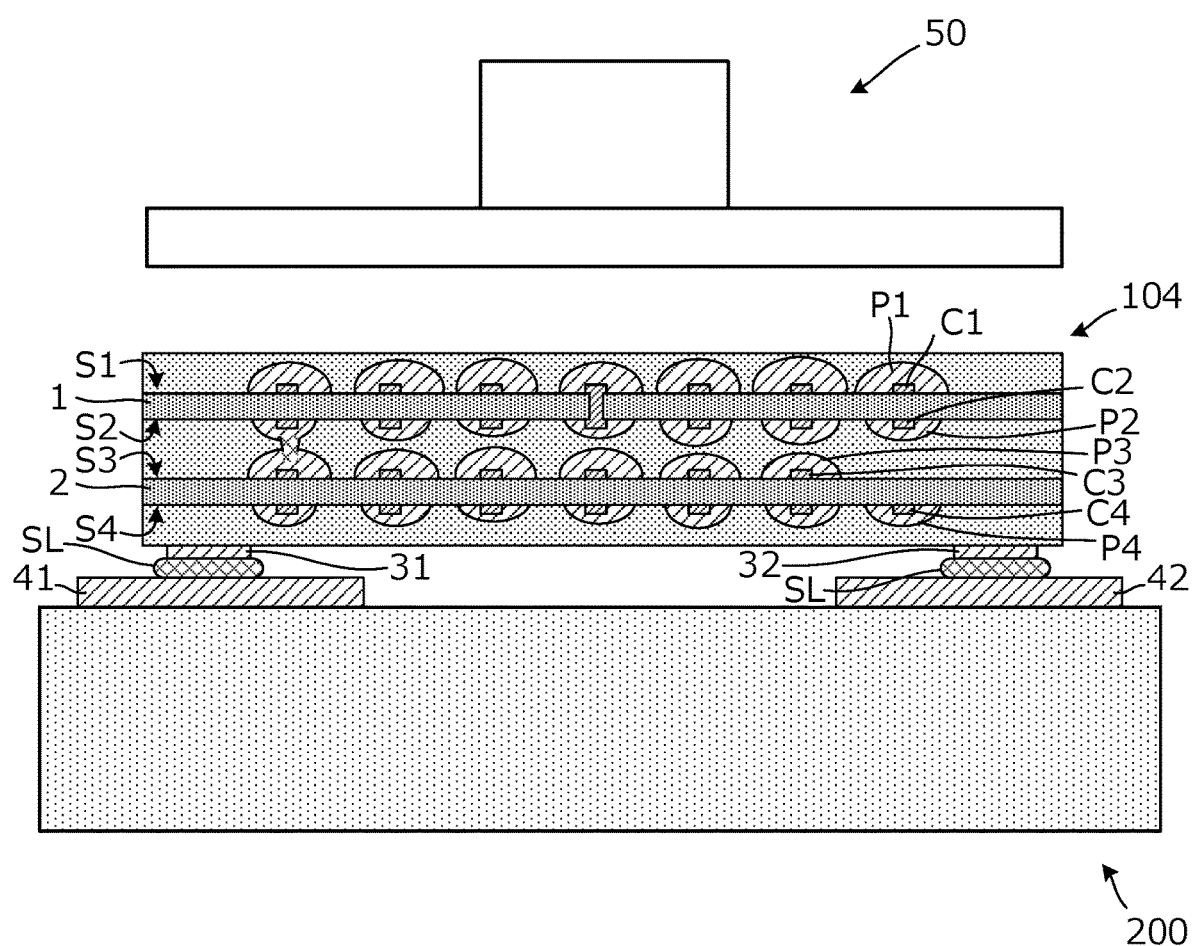
FIG. 9 illustrates a structure of a multilayer substrate according to a fourth preferred embodiment of the present invention mounted on a circuit board and a method for mounting the multilayer substrate.

FIG. 9 illustrates a structure of a multilayer substrate 104 according to a fourth preferred embodiment of the present invention mounted on a circuit board and a method for mounting the multilayer substrate.

Pad electrodes 41 and 42 are disposed on a circuit board 200 and include solder paste SL printed on their surfaces. The multilayer substrate 104 is mounted on the circuit board 200 with the terminal electrodes 31 and 32 facing the pad electrodes 41 and 42. The surface of the multilayer substrate 104 opposite to the surface provided with the terminal electrodes 31 and 32 is heated and pressed with the hot bar 50. The terminal electrodes 31 and 32 are then soldered to the pad electrodes 41 and 42.

In the present preferred embodiment, unlike in the example illustrated in FIG. 2B, the plated film P3 of the third conductor pattern disposed on the third surface S3 of the second resin substrate 2 is thicker than the plated film P4 of the fourth conductor pattern disposed on the fourth surface S4 of the second resin substrate 2. The other components of the present preferred embodiment are the same or substantially the same as those described in the first preferred embodiment.

As in the present preferred embodiment, it suffices that the plated film P2 of the second conductor pattern is thinner than the plated film P1 of the first conductor pattern when only the upper surface of the multilayer substrate 104 is heated and pressed when the multilayer substrate 104 is mounted on the circuit board. Thus, as in the present preferred embodiment, for example, thick, thin, thick, and thin plated films, for example, of the conductor patterns may preferably be arranged in this order from above. In addition, the plated film P4 of the conductor pattern (fourth conductor pattern) disposed closer to the mount surface may be thinner than the plated film P3 of the opposite conductor pattern (third conductor pattern).

Fifth Preferred Embodiment

Figure 10:
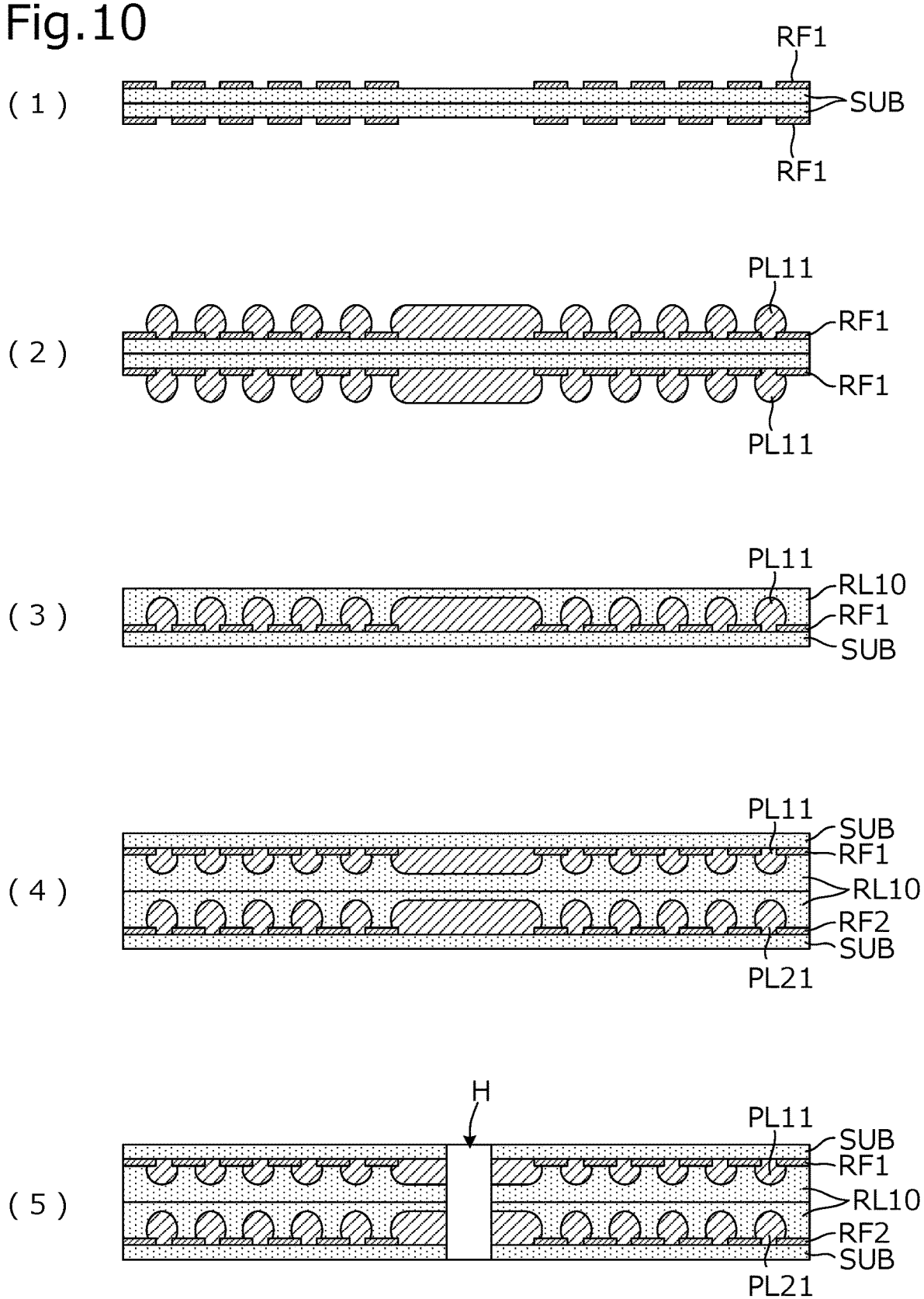
FIG. 10 illustrates the sequence of the procedure in the method for manufacturing a multilayer substrate according to a fifth preferred embodiment of the present invention.
Figure 11:
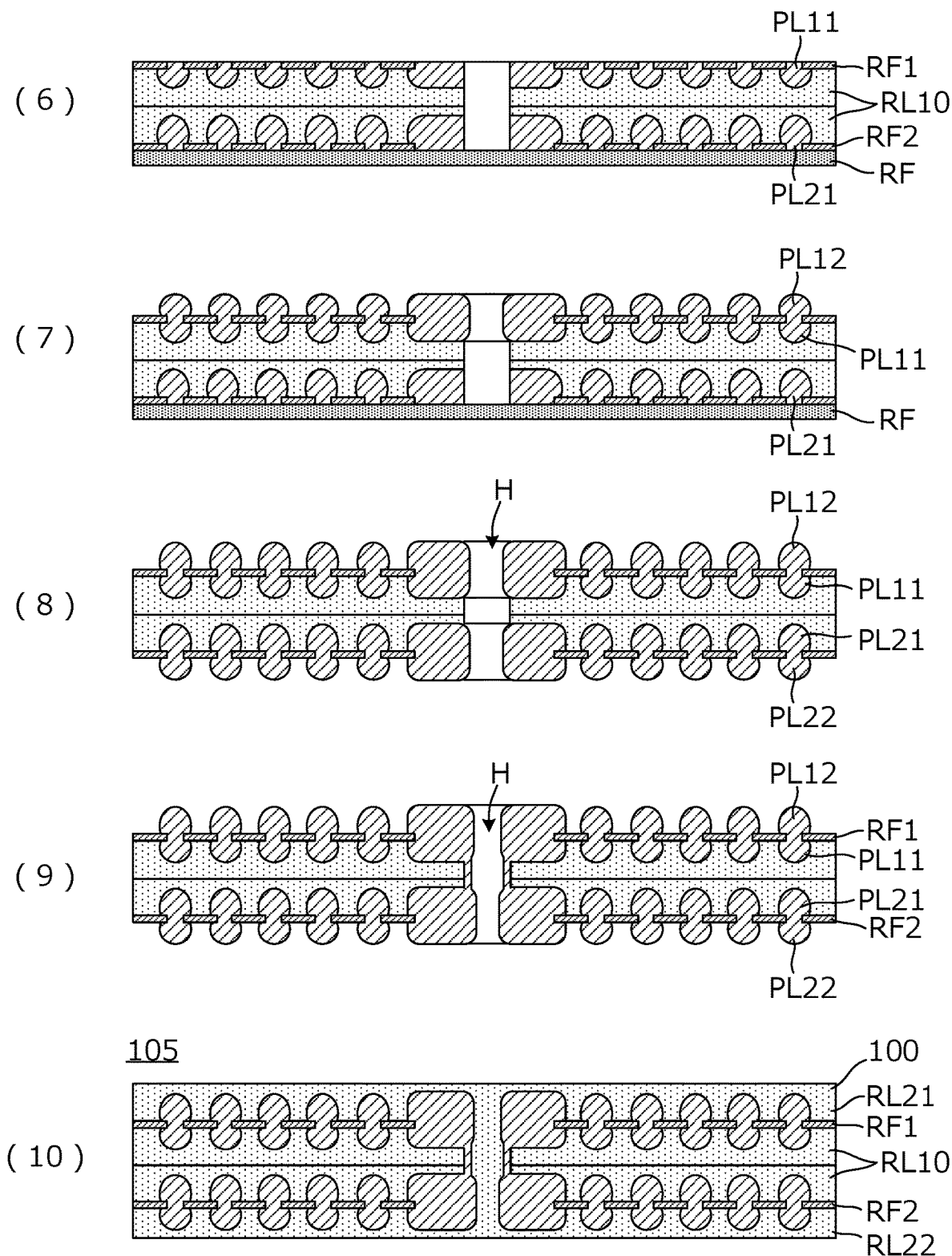
FIG. 11 illustrates the sequence of the procedure in the method for manufacturing the multilayer substrate according to the fifth preferred embodiment of the present invention, following the sequence illustrated in FIG. 10.

FIGS. 10 and 11 illustrate a method for manufacturing a multilayer substrate 105 according to a fifth preferred embodiment of the present invention in order of the steps. The manufacturing method is as follows.

Firstly, photosensitive photoresist films RF1 are applied to the surfaces of substrates SUB including, for example, copper foil to define and function as a base layer. Patterns on both surfaces of the substrates SUB are concurrently formed by welding the surrounding portions thereof with ultrasonic waves or by bonding them with an adhesive.

The photosensitive photoresists are then exposed to ultraviolet rays through photomasks. A laser drawing machine may directly irradiate the resists with ultraviolet rays to draw fine patterns. Subsequently, the resist films RF1 on the surfaces of the substrates SUB are developed into patterns.

Subsequently, plated films PL11 are deposited in the openings of the resist films RF1 by copper electroplating.

The substrates SUB are separated into two sheets, and a resin layer RL10 is laminated on one of the separated substrates SUB so that the plated film PL11 is embedded. Although not illustrated, the resin layer RL10 is laminated on the other of the substrates SUB so that the plated film PL21 is embedded. The plated film PL11 is preferably thinner than the plated film PL21.

The resin layer RL10 on one of the substrates SUB and the resin layer RL10 on the other of the substrates SUB face each other and are hot-pressed. Here, the thin plated film PL11 and the thick plated film PL21 face each other, and are thus prevented from causing a short circuit.

The surfaces of the substrates SUB are covered with protection films (not illustrated), and then a hole H is formed.

The substrates SUB on both surfaces are removed and a resist film RF is formed on one surface.

The structure in this state is subjected to copper electroplating to deposit the plated film PL12 on the exposed plated film PL11.

The resist film RF is removed, and copper electroplating is performed again to deposit the plated film PL22 on the plated film PL21. In addition, the plated film PL12 is thickened.

A metal catalyst is adsorbed on the inner wall of the hole H, and copper electroplating is performed again to form a plated film on the inner wall of the hole H.

Thereafter, the resin layers RL21 and RL22 are printed. Concurrently, a resin is filled in the hole H.

In the above steps, the multilayer substrate 105 is formed. In FIGS. 10 and 11, the resist film RF1 corresponds to a "first resin substrate", and the resist film RF2 corresponds to a "second resin substrate". The resin layers RL10 correspond to a "bonding layer". The plated films PL12, PL11, PL21, and PL22 respectively correspond to a "first conductor pattern", a "second conductor pattern", a "third conductor pattern", and a "fourth conductor pattern".

According to the present preferred embodiment, a portion of the conductor patterns is embedded in the resin substrates. In this structure, the thickness of the portion of the conductor patterns embedded in the resin substrates (specifically, the thickness of the resin substrates) also defines and functions as the thickness of the plated films. Therefore, when the distance between conductor patterns adjacent to each other in the lamination direction is left unchanged, the conductor patterns is able to have a larger cross-sectional area accordingly. Thus, a multilayer substrate including coil conductor patterns having a small conductor loss are obtained. When the cross-sectional areas of the conductor patterns are left unchanged, the distance between the conductor patterns adjacent in the lamination direction is able to be increased.

Sixth Preferred Embodiment

Figure 12:
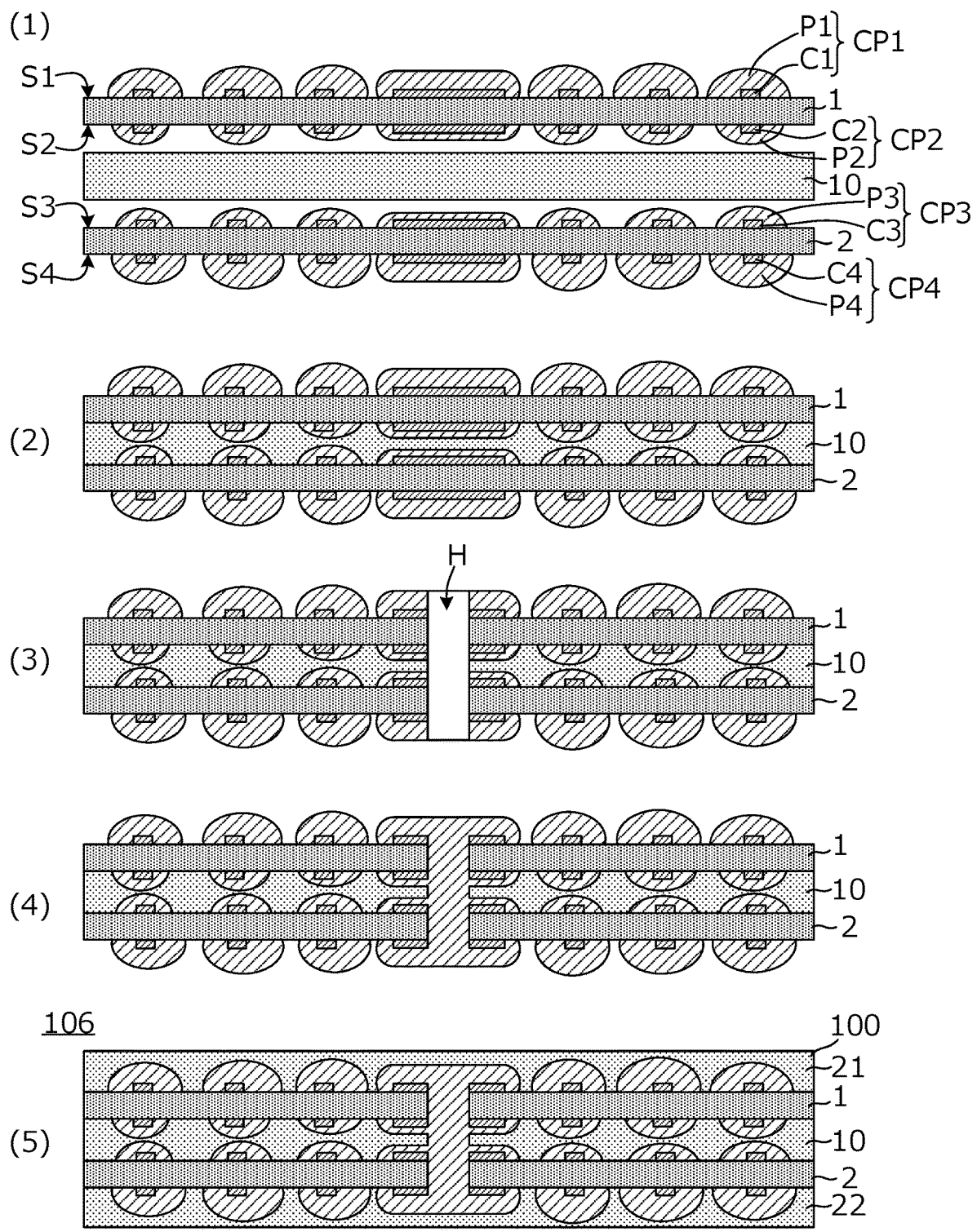
FIG. 12 illustrates the sequence of the procedure in the method for manufacturing a multilayer substrate according to a sixth preferred embodiment of the present invention.

FIG. 12 illustrates a method for manufacturing a multilayer substrate 106 according to a sixth preferred embodiment of the present invention in order of the steps. The manufacturing method is as follows.

The first conductor pattern CP1 and the second conductor pattern CP2 are disposed on both surfaces of the first resin substrate 1. Similarly, the third conductor pattern CP3 and the fourth conductor pattern CP4 are disposed on both surfaces of the second resin substrate 2. The second conductor pattern CP2 is thinner than the first conductor pattern CP1, and the third conductor pattern CP3 is thinner than the fourth conductor pattern CP4. The method for manufacturing these conductor patterns is as described above in the first preferred embodiment.

The first resin substrate 1 and the second resin substrate 2 are laminated one on the other with the bonding layer interposed therebetween, and hot-pressed preferably at, for example, about 300° C. and a predetermined pressure to form a lamination body. Here, the relatively thin second conductor pattern CP2 and the relatively thin third conductor pattern CP3 face each other, and thus a short circuit therebetween is prevented.

A hole H is formed in the lamination body.

A metal catalyst is adsorbed on the inner wall of the hole H and the hole H is filled with the plated film preferably by copper plating, for example. The plated film in the hole H forms an interlayer connection conductor.

Thereafter, the cover layers 21 and 22 are bonded.

The multilayer substrate 106 is formed by the above steps. As described in the present preferred embodiment, the present invention is applicable to form a multilayer substrate including interlayer connection conductors extending through different resin substrates.

The conductor patterns disposed on both surfaces of the resin substrate may be connected together with interlayer connection conductors disposed at a plurality of portions. In this structure, the conductor patterns are connected in parallel in the lamination direction. Thus, a multilayer substrate including conductor patterns having a small conductor loss is able to be obtained.

The present invention is not limited to the above-described preferred embodiments. For example, in the above description, the plated films are deposited by electroplating. However, the plated film may be deposited by electroless plating.

The conductor patterns may be films that are plated and then ground by a predetermined thickness to have a uniform thickness, instead of the plated films without being processed.

In the description above, the resin substrates 1 and 2 and other components are preferably made of a liquid crystal polymer, for example, but may be a polyimide resin, instead. The bonding layer 10 may be made of a polyimide resin, instead of epoxy resin.

It is not essential for the bonding layer to have higher fluidity than the resin substrate at a pressing temperature. For example, a resin material including glass fiber may be used as the material for the bonding layer.

In preferred embodiments of the present invention, the first conductor pattern is not limited to be the outermost one of the plurality of conductor patterns provided on the plurality of layers in the lamination body. Another resin substrate including a conductor pattern provided thereon may be disposed closer to the outermost layer than the first resin substrate is, as long as the conductor pattern does not face the first conductor pattern with the bonding layer interposed therebetween.

The multilayer substrates according to preferred embodiments of the present invention is not limited to a coil device and is applicable to any of various types of electronic components such as an antenna, an actuator, or a sensor, for example. The multilayer substrate according to a preferred embodiment of the present invention may be a chip component, such as a chip inductor, for example. Thus, the present invention may be appropriately changed within the range not departing from the gist of the invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a multilayer substrate, comprising:
   forming a first conductor pattern by plating on a first surface of a first resin substrate more thickly than a second conductor pattern formed by plating on a second surface, opposite to the first surface, of the first resin substrate, forming a third conductor pattern by plating on a third surface, facing the second surface, of a second resin substrate, and forming a fourth conductor pattern by plating on a fourth surface, opposite to the third surface, of the second resin substrate; and
   after forming the first to fourth conductor patterns by plating, laminating and thermocompression-bonding together a plurality of layers including the first resin substrate, the second resin substrate, and a bonding layer including no conductor pattern while holding the bonding layer between the second surface of the first resin substrate and the third surface of the second resin substrate, and locating the first conductor pattern on the first surface closer to one outermost layer.

2. The method according to claim 1, wherein a thickness of the third conductor pattern is formed to be larger than a thickness of the fourth conductor pattern.

3. The method according to claim 1, wherein the bonding layer has higher fluidity at a predetermined pressing temperature than the first and second resin substrates.

4. The method according to claim 1, wherein the first conductor pattern, the second conductor pattern, the third conductor pattern, and the fourth conductor pattern each include a base made of metal foil and a plated film that is thicker than the base.

5. The method according to claim 4, wherein the metal foil is copper foil and the plated film is a copper-plated film.

6. The method according to claim 1, wherein the second and third conductor patterns include portions overlapping in a plan view.

7. The method according to claim 1, wherein the second resin substrate is located closer to a mount surface than the first resin substrate is.

8. The method according to claim 1, wherein the second conductor pattern is arranged at a uniform pitch in a cross section taken in a lamination direction in which the first resin substrate and the second resin substrate are laminated, and the third conductor pattern is arranged at a uniform pitch in the cross section and displaced from the second conductor pattern in a direction of the pitch.

9. The method according to claim 1, wherein each of the first to fourth conductor patterns is a coil conductor pattern.

10. The method according to claim 1, wherein
   a terminal electrode is disposed on a mount surface of a lamination body including the first and second resin substrates and the bonding layer laminated together; and
   the mount surface is located closer to the second resin substrate than to the first resin substrate.

11. The method according to claim 10, wherein the terminal electrode is disposed at a position at which the terminal electrode does not overlap the first to fourth conductor patterns in a plan view.

* * * * *